US008422247B2

(12) United States Patent
Kameyama

(10) Patent No.: US 8,422,247 B2
(45) Date of Patent: Apr. 16, 2013

(54) ELECTRIC APPARATUS MODULE

(75) Inventor: Isao Kameyama, Susono (JP)

(73) Assignee: Yazaki Corporation, Tokyo (JP)

( * ) Notice: Subject to any disclaimer, the term of this patent is extended or adjusted under 35 U.S.C. 154(b) by 368 days.

(21) Appl. No.: 12/993,963

(22) PCT Filed: May 21, 2009

(86) PCT No.: PCT/JP2009/059381
§ 371 (c)(1), (2), (4) Date: Nov. 22, 2010

(87) PCT Pub. No.: WO2009/142276
PCT Pub. Date: Nov. 26, 2009

(65) Prior Publication Data

US 2011/0096524 A1 Apr. 28, 2011

(30) Foreign Application Priority Data

May 22, 2008 (JP) ................................ 2008-133976

(51) Int. Cl.
*H05K 7/18* (2006.01)

(52) U.S. Cl.
USPC .......... 361/799; 361/818; 361/752; 361/810; 174/258

(58) Field of Classification Search .................. 361/799, 361/810
See application file for complete search history.

(56) References Cited

U.S. PATENT DOCUMENTS

| | | | | |
|---|---|---|---|---|
| 5,520,554 | A | 5/1996 | Henningsson et al. | |
| 6,666,719 | B1 * | 12/2003 | Kuroi et al. | 439/607.19 |
| 2002/0101041 | A1 * | 8/2002 | Kameyama | 277/628 |
| 2002/0142658 | A1 * | 10/2002 | Koide et al. | 439/610 |
| 2005/0239326 | A1 | 10/2005 | Ishikura et al. | |
| 2010/0041268 | A1 | 2/2010 | Okada et al. | |
| 2010/0265389 | A1 | 10/2010 | Mizumura | |

FOREIGN PATENT DOCUMENTS

| | | | |
|---|---|---|---|
| JP | 9-511619 | A | 11/1997 |
| JP | 2005-347243 | A | 12/2005 |
| JP | 2006-327514 | A | 12/2006 |
| JP | 2008-066083 | A | 3/2008 |

OTHER PUBLICATIONS

International Search Report (PCT/ISA/210) issued for PCT/JP2009/059381, dated Jul. 28, 2009.

* cited by examiner

*Primary Examiner* — Tuan T Dinh
*Assistant Examiner* — Steven Sawyer
(74) *Attorney, Agent, or Firm* — Sughrue Mion, PLLC

(57) ABSTRACT

An electric apparatus module 1 includes an upper casing 6, a lower casing 7 to which the upper casing 6 is attached and which is attached to a rear panel 2, an electronic device unit 8 accommodated in the upper casing 6 and the lower casing 7, a conductive shield shell 9 covering the electronic device unit 8, and a conductive ground shell 10 which is attached to the lower casing 7 at a side of the rear panel 2. The ground shell 10 includes a flat plate portion 83 piled on the rear panel 2, a contact piece 84 erected from an outer edge 83*c* of the flat plate portion 83 toward the lower case 7, and a contact member 85 protruded from a rear surface 83*b* of the flat plate portion 83 at the side of the rear panel 2. The contact piece 84 is inserted through a through hole 56 formed on the lower casing 7 to contact with the shield shell 9. The contact member 85 is inserted through a through hole 11 formed on the rear panel 2 to contact a cylindrical shield member 22 of an external device.

3 Claims, 5 Drawing Sheets

ELECTRIC APPARATUS MODULE

TECHNICAL FIELD

The present invention relates to an electric apparatus module which is configured by housing, within a casing, a camera module as an electronic device unit to be attached to a predetermined position such as the upper portion of the rear side of an automobile, for example.

BACKGROUND TECHNIQUE

There is a case that an electric apparatus module is mounted which is configured by housing, within a casing, a camera module as an electronic device unit to be attached to a predetermined position such as the upper portion of the rear side of an automobile as movable body. The electric apparatus module includes an upper casing, a lower casing to which the upper casing is attached and which is attached to the panel of an automobile as a subject member to which the upper casing is attached, a camera module as the electronic device unit which is housed between the upper casing and the lower casing, and a coupling unit for coupling the camera module with an external device (see a PTL 1, for example).

The camera module includes a CCD camera configured by an image pick-up element such as a CCD and an optical element such as lenses etc., a printed wiring board on which the CCD camera is mounted, and a connector for the coupling with the coupling unit to be attached to the printed wiring board. The coupling unit includes a connector for the coupling with the external device to be attached to the lower casing, a connector for the coupling with the camera module, and an FPC for coupling these connectors to each other in a manner that these connectors are attached to the both ends of the FPC respectively.

The electric apparatus module thus configured is assembled in a manner that the camera module is attached to the upper casing, then the connector for the coupling with the external device of the coupling unit is attaché to the lower casing, and the connector for the coupling with the camera module is attached to the connector of the camera module while bending the FPC and also these casings are attached to each other.

In the electric apparatus module thus assembled, the connector of the wire harness wired in the automobile is attached to the connector for the coupling with the external device, and the lower casing etc. are attached to a panel disposed at the upper portion of the rear side of the body of the automobile. Then, in the electric apparatus module, the camera module is coupled via the wire harness to a monitor as the external device which is attached to an instrument panel etc., whereby an image picked-up by the camera module is displayed on the monitor.

In recent years, in general, a camera mounted on a vehicle is a digital camera. In this case, since a signal transmitted between the aforesaid camera module and the monitor is a digital signal, the signal is likely influenced by noise and so a normal operation may be interfered. Further, since the monitor is required to have a high resolution and to be able to display an image picked-up by the camera module in real-time, an amount of the signal transmitted to the monitor from the camera module tends to increase.

Thus, in the aforesaid electric apparatus module, in order to prevent the leakage of electric noise to the outside from the camera module and to prevent the entering of electric noise into the camera module from the outside, it is proposed to surround the camera module by a conductive shield shell to thereby electrically shield from the outside (see a PTL 2, for example).

The electric apparatus module disclosed in the PTL 2 is configured to prevent the entering of electric noise into the camera module from the outside in a manner that the shield shell is coupled to a printed wiring board to thereby couple to a grounding circuit and a coupling unit coupled to the printed wiring board is coupled to the drain line of a wire harness.

CITATION LIST

[PTL 1] JP-A-2005-347243

[PTL 2] JP-A-2008-066083

SUMMARY OF INVENTION

Technical Problem

In the electric apparatus module disclosed in the PTL 2, when external noise enters into the camera module, the noise is transmitted to the shield shell. Then, the noise is released to the outside of the wire harness via the printed wiring board coupled to the shield shell and the drain line coupled to the coupling unit. Thus, there arises a problem that the shielding efficiency maybe degraded since noise may enter from the printed wiring board side of the camera module.

Accordingly, an object of the invention is to provide an electric apparatus module which can obtain good shielding efficiency.

Solution to Problem

In order to solve the aforesaid problem and attain the object, the first aspect of the invention relates to an electric apparatus module which includes an upper casing; a shield member of a cylindrical shape which covers a connector; a lower casing which is attached to an attached member having a first through hole and includes a second through hole, and to which the upper casing is attached; an electronic device unit which is housed within the upper casing and the lower casing and coupled to the connector; a conductive shield shell which covers the electronic device unit; and a conductive ground shell which includes a flat plate portion, a contact piece and a contact member and is provided between the lower casing and the attached member, wherein the flat plate portion is provided in a manner of being piled on the attached member, the contact piece is erected from the outer edge of the flat plate portion and contacts with the shield shell via the second through hole, the contact member protrudes from a surface on the attached member side of the flat plate portion and contacts with the cylindrical shield member via the first through hole.

The second aspect of the invention relates to the electric apparatus module in which the contact piece includes a contact portion which contacts with the shield shell, and an elastic deformation portion which is provided between the contact portion and the flat plate portion and elastically deforms so as to allow the contact portion to deform in a direction of contacting with and separating from the flat plate portion.

The third aspect of the invention relates to the electric apparatus module in which a plurality of the contact pieces are provided with an interval therebetween along the outer edge of the flat plate portion.

The fourth aspect of the invention relates to the electric apparatus module in which the contact member is configured in a cylindrical shape having an outer diameter almost same as an inner diameter of the shield member, and inserted into the shield member and contacts therewith in a manner that the inner surface of the shield member is overlapped on the outer surface of the contact member.

According to the first aspect of the invention, the conductive ground shell to be attached to the lower casing to be attached to the attached member includes the flat plate portion to be superimposed on the attached member; the contact piece which is erected from the outer edge of the flat plate portion toward the lower casing, then passed through the hole penetrating the lower casing and contacts with the conductive shield shell covering the electronic device unit; and the contact member which is protruded from the surface on the attached member side of the flat plate portion, then passed through the hole penetrating the attached member and contacts with the cylindrical shield member of the connector of an external device. Thus, the shield shell covering the electronic device unit is made directly in contact with the ground shell to thereby directly contact the ground shell to the shield member of the connector to thereby couple to the attached member.

According to the second aspect of the invention, the contact piece includes the contact portion which contacts with the shield shell, and the elastic deformation portion which is provided between the contact portion and the flat plate portion and elastically deforms so as to allow the contact portion to deform in the direction of contacting with and separating from the flat plate portion. Thus, the contact piece of the ground shell can be easily and surely made in contact with the shield shell.

According to the third aspect of the invention, since the plurality of contact pieces are provided with the interval therebetween along the outer edge of the flat plate portion, a plurality of the contact portions are provided between the shield shell and the ground shell and the contact portions are disposed around the electronic device unit. Thus, the shield shell and the ground shell can be directly made in contact to each other surely.

According to the fourth aspect of the invention, the contact member is configured in the cylindrical shape having the outer diameter almost same as the inner diameter of the shield member, and inserted into the shield member and contacts therewith in a manner that the inner surface of the shield member is overlapped on the outer surface of the contact member. Thus, the ground shell can be made in contact with the shield member of the connector by inserting the contact member into the shield member.

Advantageous Effects of Invention

As explained above, according to the first aspect of the invention, since the shield shell covering the electronic device unit is made directly in contact with the ground shell to thereby directly contact the ground shell to the shield member of the connector to thereby couple to the attached member, noise entering into the electronic device unit from the outside can be released to the attached member via the shield shell, the shield member and the ground shell without passing through an electric circuit coupled to the electronic device unit. Thus, the entering of noise can be surely prevented and so good shielding efficiency can be attained. Further, since the shield shell and the shield member of the connector can be coupled to the attached member via the ground shell, the increase of the number of components and the number of assembling processes can be suppressed. Thus, the assembling procedure can be performed easily.

According to the second aspect of the invention, since the contact piece of the ground shell can be easily and surely made in contact with the shield shell, the shield shell can be surely coupled to the attached member via the ground shell and the coupling procedure between the shield shell and the ground shell can be simplified. As a result, noise entering into the electronic device unit from the outside can be surely released to the attached member via the shield shell and the ground shell. Further, the number of the processes for assembling the shield shell and the ground shell can beg suppressed.

According to the third aspect of the invention, a plurality of the contact portions are provided between the shield shell and the ground shell and the contact portions are disposed around the electronic device unit. Thus, since the shield shell and the ground shell can be directly made in contact to each other surely, the shield shell can be surely coupled to the attached member via the ground shell. As a result, noise entering into the electronic device unit from the outside can be surely released to the attached member via the shield shell and the ground shell.

According to the fourth aspect of the invention, since the ground shell can be made in contact with the shield member of the connector by inserting the contact member into the shield member, the ground shell can be easily and surely made in contact with the shield member of the connector. Thus, the shield member of the connector can be easily coupled to the attached member via the ground shell and the coupling procedure between the shield member of the connector and the ground shell can be simplified. As a result, noise entering into the electronic device unit from the outside can be surely released to the attached member via the shield member of the connector and the ground shell. Further, the number of the processes for assembling the shield member of the connector and the ground shell can beg suppressed.

DESCRIPTION OF EMBODIMENTS

Embodiment 1

An electric apparatus module according to an embodiment of the invention will be explained with reference to FIGS. 1 to 5. The electric apparatus module 1 shown in FIG. 1 etc. is attached to the upper portion of the rear side of an automobile (for example, the upper portion of a rear panel 2) etc.

Figure 1:
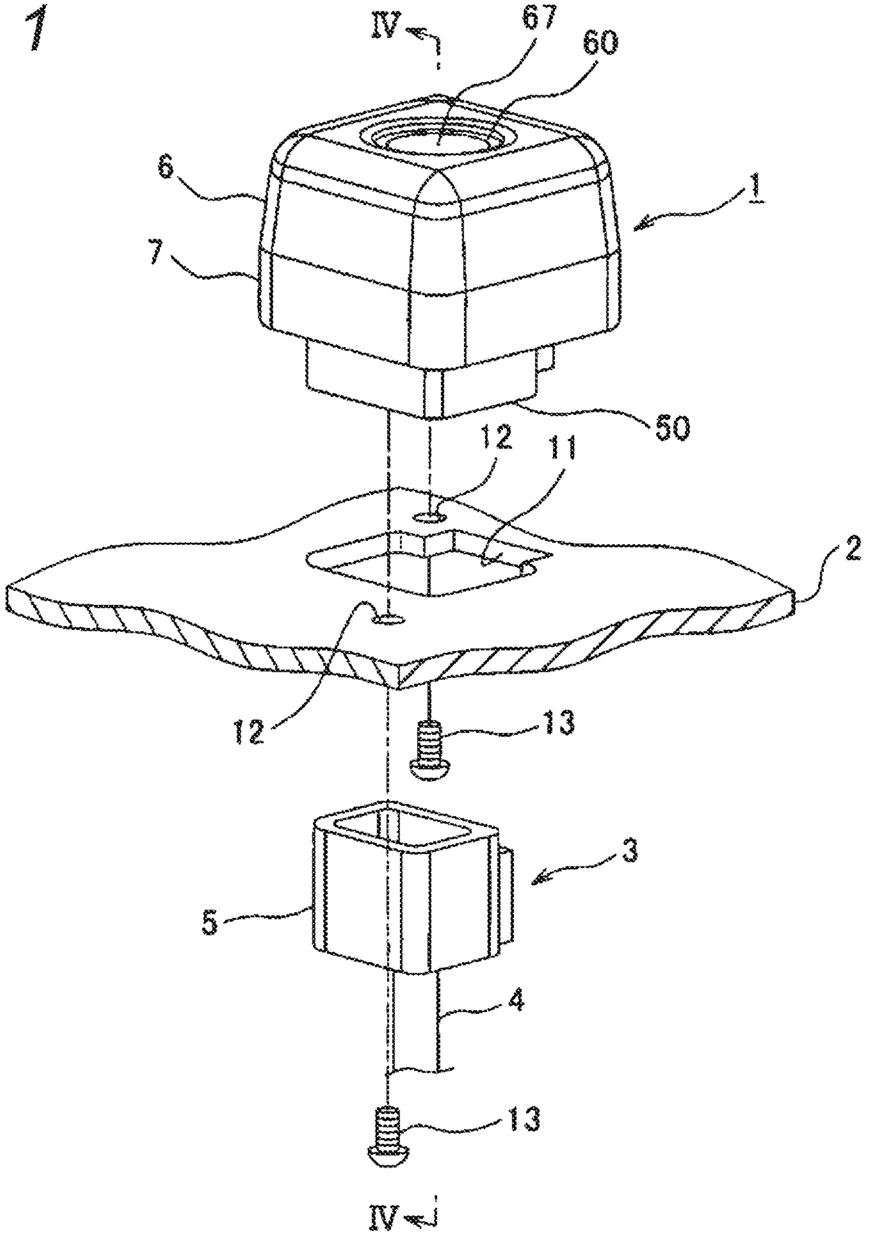
FIG. 1 is a perspective view of an electric apparatus module etc. according to an embodiment of the invention.

The rear panel 2 is a part of the body of an automobile and configured by a sheet metal etc. As shown in FIG. 1, the rear panel 2 is provided with a hole 11 for passing a connector 5 provided at the end portion of a wire harness 3 wired within the automobile and holes 12 for passing screws 13. The wire harness 3 is coupled to a monitor (not shown) as an external device to be attached to the instrument panel of the automobile.

The wire harness 3 includes a shield harness 4 and the connector 5 to be attached to the end portion of the shield harness 4. The connector 5 corresponds to the connector of the external device described in claims. The shield harness 4 includes a plurality of electric wires 15, a braided wire 16 and a sheath 17.

Each of the plurality of electric wires 15 is a so-called a covered electric wire having a core wire 18 and a covering portion 19 for covering the core wire 18. The braided wire 16 is formed in a cylindrical shape as a whole in such a manner that element wires formed by conductive metal material etc. are braided. The braided wire covers the outer periphery of the plurality of electric wires 15. The sheath 17 is formed by composite resin having insulative property. The sheath is formed by the extrusion molding around the outer periphery of the braided wire 16 covering the outer peripheries of the plurality of electric wires 15 to thereby cover the outer periphery of the braided wire 16.

In the shield harness 4 configured in the aforesaid manner, the sheath 17 at the end portion thereof is subjected to the sheath stripping for tearing off a predetermined length thereof to thereby expose the end portions of the plurality of electric wires 15 and the braided wire 16. Then, in the shield harness 4, the terminal attachments 24 described later of the connector 5 are respectively coupled to the end portions of the plurality of electric wires 15 and the shield member 22 described later of the connector 5 is coupled to the end portion of the braided wire 16.

Figure 3:
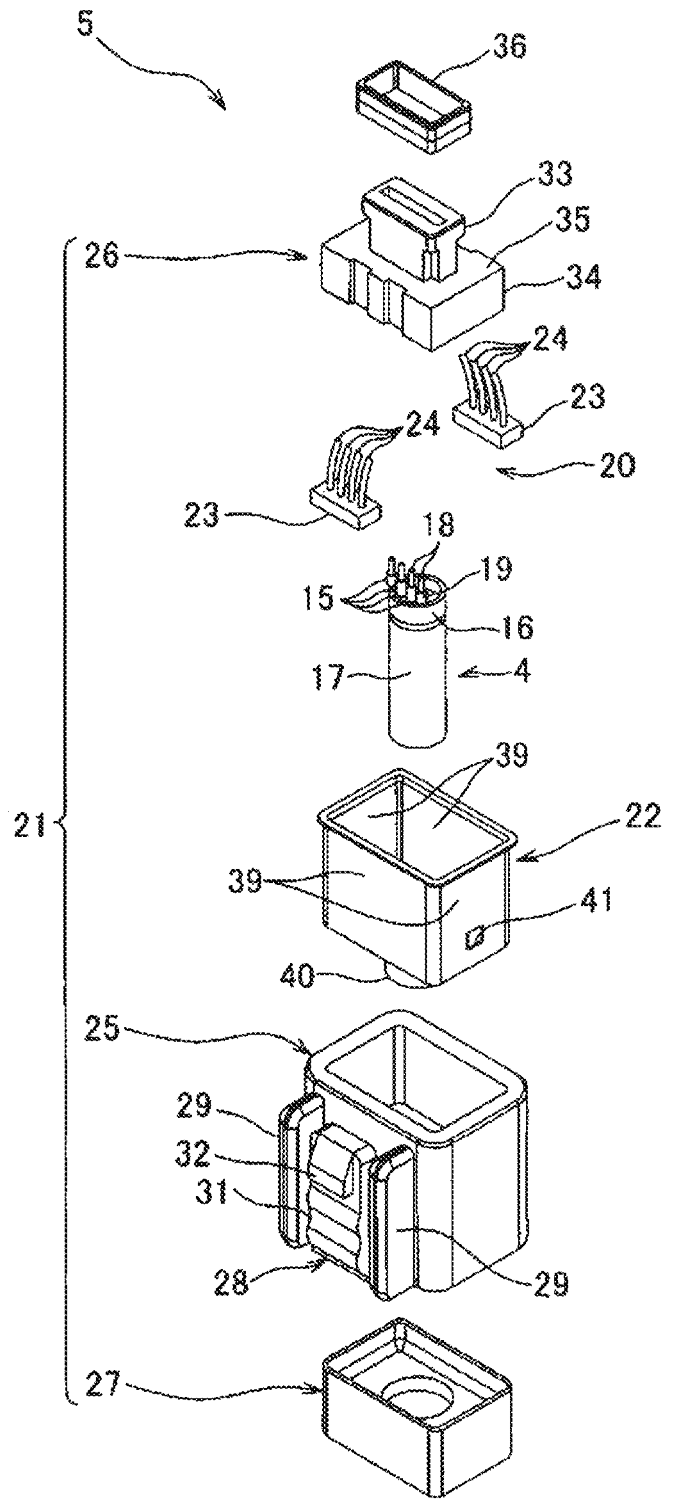
FIG. 3 is an exploded perspective view of a connector to be electrically coupled to the electric apparatus module shown in FIG. 1.

As shown in FIG. 3, the connector 5 includes insert terminals 20, a connector housing 21 and the shield member 22. A pair of the insert terminals 20 are provided, whereby these insert terminals are attached to each other and housed within an inner housing 26 described later of the connector housing 21. The insert terminal 20 includes a block member 23 and a plurality of the terminal attachments 24.

The block member 23 is formed by insulative composite resin and configured in a rectangular block shape. The block member 23 holds the plurality of the terminal attachments 24 in a manner of burying the end portions of the plurality of the terminal attachments 24 therein. The block member 23 is formed integrally with the plurality of the terminal attachments 24 by the insert molding.

Each of the plurality of the terminal attachments 24 is formed by conductive metal etc. and configured in a rod shape. Each of the plurality of the terminal attachments 24 is attached to the block member 23 in a state that the one end portion thereof is located within the block member 23 and the other end portion thereof protrudes from the block member 23. The plurality of the terminal attachments 24 are disposed in parallel from one another. Each of the plurality of the terminal attachments 24 is arranged in a manner that one end portion thereof is electrically coupled to corresponding one of the electric wires 15 of the shield harness 4 of the wire harness 3 and the other end portion thereof is electrically coupled to the coupling unit 70 of an electronic device unit 8 described later of the electric apparatus module 1.

The connector housing 21 is formed by insulative composite resin etc. and includes, as shown in FIG. 3, an outer housing 25 of a cylindrical shape, the inner housing 26 housed within the outer housing 25, and a rear holder 27 attached to the outer housing 25.

The outer housing 25 is formed by insulative composite resin. As shown in FIG. 3, the outer housing 25 is configured in a rectangular cylindrical shape and houses therein the inner housing 26 and the shield member 22. The outer housing 25 is provided with a lock arm 28 opposing the connector portion 50 described later of the lower casing 7 of the electric apparatus module 1, a pair of guide ribs 28 and engagement projections 30.

Figure 4:
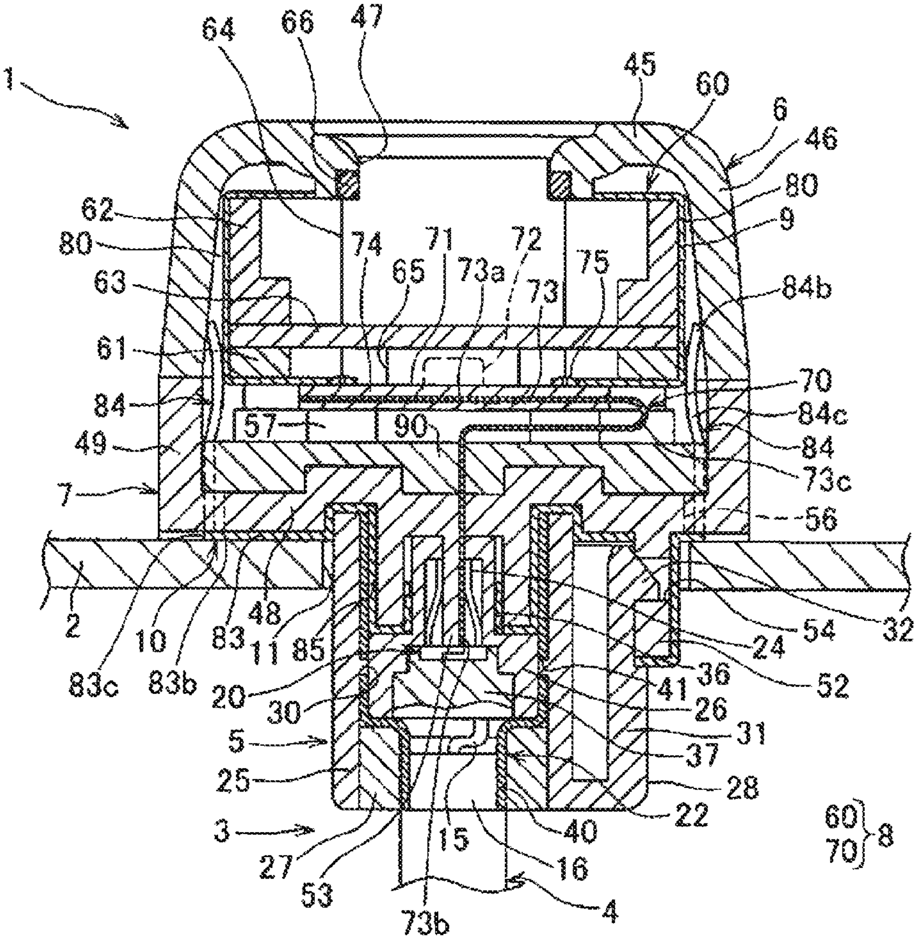
FIG. 4 is a sectional diagram along a line IV-IV in FIG. 1.

As shown in FIG. 3 or 4, the lock arm 28 includes an arm portion 31 which continues to the end portion of the outer housing 25 on a side thereof apart from the electric apparatus module 1 and extends in the longitudinal direction of the outer housing 25, and a lock portion 32 which protrudes from the outer surface on the tip end side of the arm portion 31. The arm portion 31 is provided so as to be elastically deformable freely in a manner that the tip end approaches the outer surface of the outer housing 25.

The lock arm 28 thus configured is arranged in a manner that when the connector 5 engages with the connector portion 50 described later of the lower casing 7 of the electric apparatus module 1, the lock portion 32 of the lock arm 28 engages with the lock hole 54 of the connector portion 50 to thereby hold the engagement state between the connector 5 and the connector portion 50.

As shown in FIG. 3, each of the pair of guide ribs 29 protrudes from the outer surface of the outer housing 25 and extends along the longitudinal direction of the outer housing 25. The pair of guide ribs 29 are provided in parallel to each other so as to have an interval therebetween so that the lock arm 28 is sandwiched therebetween The pair of guide ribs 29 are arranged, when the connector 5 engages with the connector portion 50 described later of the lower casing 7 of the electric apparatus module 1, to position the lock receiving portion 52 of the connector portion 50 therebetween to thereby engage the connector 5 and the connector portion 50 in the correctly directed state.

As shown in FIG. 4, a plurality of the engagement projections 30 are provided so as to protrude from the inner surface of the outer housing 25. Each of the plurality of the engagement projections 30 engages with the corresponding engagement hole 41 described later of the sealed member 22 when the sealed member 22 is housed within the outer housing 25.

The inner housing 26 is formed by insulative composite resin. As shown in FIG. 3, the inner housing 26 is provided with a small diameter portion 33 formed in a rectangular cylindrical shape, a large diameter portion 34 which has an outer diameter and an inner diameter larger than those of the small diameter portion 33 and is formed in a rectangular cylindrical shape, and a step portion 35 provided between the small diameter portion 33 and the large diameter portion 34.

The small diameter portion 33 mainly houses therein the terminal attachments 24 of the insert terminals 20. A ring-shaped waterproof packing 36 formed by elastic composite resin is attached to the outer periphery of the small diameter portion 33. When the connector 5 engages with the connector portion 50 described later of the lower casing 7 of the electric apparatus module 1, the waterproof packing 36 is disposed between the outer surface of the small diameter portion 33 of the inner housing 26 and the inner surface of the cylindrical portion of the connector portion 50 to thereby keep the interval therebetween in the watertight state, whereby liquid such as water can be prevented from entering into the connector housing 21 and the lower casing 7.

The large diameter portion 34 mainly houses therein the block members 23 of the aforesaid insert terminals 20. Further, the large diameter portion 34 is filled therein with potting material 37 (shown in FIG. 4) which is filled in a liquid state and hardened. The potting material 37 is formed by silicone etc. This silicone is preferably room temperature curing silicone rubber etc. having thixotropy. The thixotropy is property that the silicone rubber before hardening is changed in a liquid state (state having high flowability) when applied with vibration of constant level or more etc. and is changed in a solid state (state having lower flowability than the liquid state) when placed in a static state.

Since the aforesaid potting material 37 has the thixotropy, when the potting material enters as the liquid state into a portion required to be watertighted, the potting material changes into the solid state while being continuously entered into the portion and so stays at the portion. Thus, the portion can be surely kept in the watertight state. Further, since the potting material 37 is the room temperature curing type, it is not necessary to apply heat in order to harden the potting material 37. Thus, the manufacturing process can be simplified and the increase of the manufacturing equipment can be prevented. The potting material 37 restricts a phenomenon that the liquid enters into the small diameter portion 33, that is, the inner housing 26 via the large diameter portion 34.

The rear holder 27 is formed by thermoplastic composite resin etc. and is configured in a cylindrical shape having the outer periphery of a rectangular shape and the inner periphery of a circular shape in section, as shown in FIG. 3. As shown in FIG. 1 or 3, the rear holder 27 is inserted into the outer housing 25 from the side thereof apart from the electric apparatus module 1, and the rear holder 27 is heated, then melted and hardened at the room temperature to thereby fix the rear holder to the inner surface of the outer housing 25, whereby the rear holder is attached to the outer housing 25. Then, the rear holder 27 is attached to the outer housing 25 and the shield harness 4 coupled to the aforesaid terminal attachments 24 is passed within the rear holder.

The shield member 22 is formed by conductive metal etc. and is configured in a rectangular cylindrical shape having a bottom wall and a peripheral wall 39 erected from the outer edges of the bottom wall, as shown in FIG. 3. The shield member 22 is configured in a manner that the outer periphery of the peripheral wall 39 is formed so as to be almost same as the inner periphery of the outer housing 25. A cylindrical insertion portion 40 for passing the shield harness 4 of the wire harness 3 therethrough is protrusively provided at the bottom wall. The peripheral wall 39 is provided with a plurality of the engagement holes 41 formed in a manner of penetrating the peripheral wall 39.

The shield member 22 configured in the aforesaid manner is housed within the outer housing 25 in a manner that the plurality of engagement projections 30 of the outer housing 25 respectively engage with the plurality of engagement holes 41. Further, the shield member houses the shield harness 4 therein in a manner that the shield harness 4 of the wire harness 3 is passed through the insertion portion 40.

The connector 5 configured in the aforesaid manner is assembled in the following manner. First, the shield harness 4 of the wire harness 3 is passed through the rear holder 27 of the connector housing 21, the outer housing 25 and the insertion portion 40 of the shield member 22. Then, the electric wires 15 of the shield harness 4 are respectively coupled to the one end portions of the terminal attachments 24 of one of the pair of insert terminals 20 in which the block members 23 thereof are assembled to each other to thereby attach the pair of insert terminals 20 with the shield harness 4.

Next, the terminal attachments 24 of the pair of insert terminals 20 are positioned within the small diameter portion 33 of the inner housing 26 to which the waterproof packing is attached in advance, and the block members 23 of the pair of insert terminals 20 are positioned within the large diameter portion 34 of the inner housing to thereby house, within the inner housing 26, the pair of insert terminals 20 to which the shield harness 4 is attached.

Thereafter, the potting material 37 in the liquid state is filled within the large diameter portion 34 of the inner housing 26 and then the potting material 37 is hardened. Thus, the shield harness 4 and the pair of insert terminals 20 are attached to the inner housing 26.

Succeedingly, the inner housing 26 to which the shield harness 4 and the pair of insert terminals 20 are attached is inserted within the shield member 22. Then, the shield member 22 in which the aforesaid inner housing 26 is housed is inserted within the outer housing 25 to thereby engage the plurality of engagement projections 30 of the outer housing 25 with the plurality of engagement hole 41 of the sealed member 22, respectively, whereby the shield member 22 is housed within the outer housing 25.

Lastly, the rear holder 27 is inserted into the outer housing 25 from the side thereof apart from the electric apparatus module 1, and the rear holder is heated, then melted and hardened at the room temperature to thereby fix the rear holder to the inner surface of the outer housing 25, whereby the rear holder 27 is attached to the outer housing 25. In this manner, the connector 5 is assembled.

Figure 2:
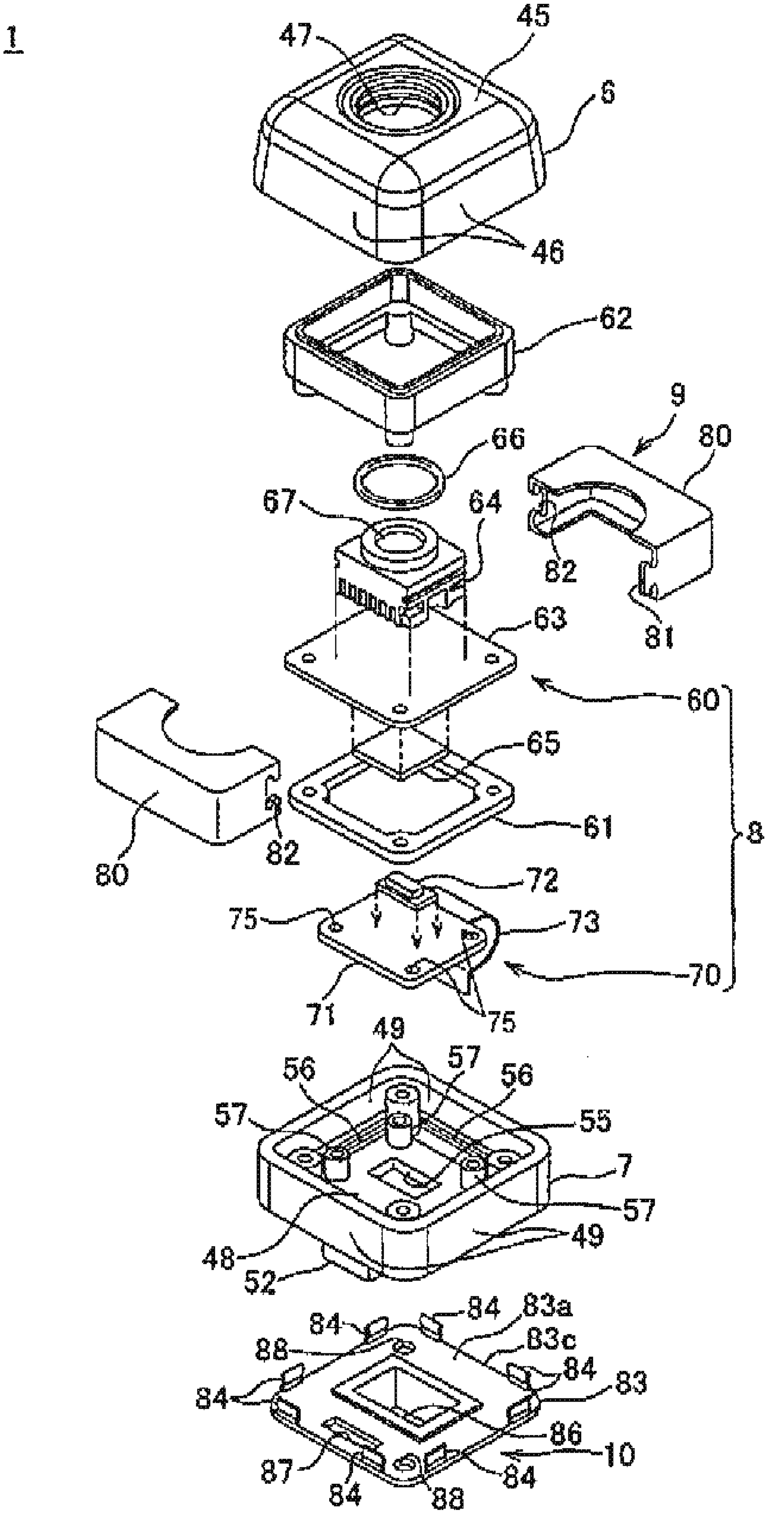
FIG. 2 is an exploded perspective view of the electric apparatus module shown in FIG. 1.

As shown in FIGS. 2 and 4, the electric apparatus module 1 includes an upper casing 6, the lower casing 7, the electronic device unit 8, a shield shell 9 and a ground shell 10.

The upper casing 6 is formed by metal and, as shown in FIG. 2, includes a ceiling wall 45 and a peripheral wall 46 erected from the outer edges of the ceiling wall 45. A round hole 47 is provided so as to penetrate the ceiling wall 45.

The lower casing 7 is formed by metal and, as shown in FIG. 2, includes a bottom wall 48 and a peripheral wall 49 erected from the outer edges of the bottom wall 48. The bottom wall 48 is provided with the connector portion 50 having a rectangular cylindrical shape to be fitted to the connector 5 and not-shown screw holes. The screw holes are provided so as to penetrate the bottom wall 48 and the screws 13 are inserted into the screw holes.

The connector portion 50 includes the cylindrical portion erected from the bottom wall 48, the lock receiving portion 52 to be engaged with the lock arm 28 of the connector 5, and an erected plate portion 53 which is provided at the inner side of the cylindrical portion and erected from the bottom wall 48. The cylindrical portion is inserted within the hole 11 of the rear panel 2 and entered between the outer housing 25 and the inner housing 26 of the connector 5.

The lock receiving portion 52 is erected from the bottom wall 48 and formed in an rectangular wall shape. The lock receiving portion 52 is provided with a lock hole 54 penetrating the lock receiving portion 52. The lock portion 32 of the lock arm 28 of the connector 5 engages with the lock hole 54, whereby the lock receiving portion 52 engages with the lock arm 28. The erected plate portion 53 couples with the terminal attachments 24 of the connector 5.

An opening portion 55 opened within the cylindrical portion and a plurality of holes 56 penetrate through the bottom wall 48 of the lower casing 7. The opening portion 55 is arranged in a manner that the height of the edge thereof coincides with that of the surface of the erected plate portion 53. The plurality of holes 56 are provided with an interval thereamong along the outer periphery of the bottom wall 48. The contact pieces 84 described later of the ground shell 10 are passed through the plurality of holes 56, respectively.

Further, the bottom wall 48 of the lower casing 7 is provided with bosses 57 which engage with the through holes 75 of the board 71 of the coupling unit 70 described later of the electronic device unit 8. A plurality of the bosses 57 are provided so as to be erected from the bottom wall 48 toward the inner side of the lower casing 7. The aforesaid upper casing 7 and the lower casing 6 are attached to each other in a manner that the edges of the peripheral walls 46 and 49 are laminated to each other.

As shown in FIG. 2, the electronic device unit 8 includes a camera unit 60 and the coupling unit 70. The camera unit 60 includes a frame member 61, a shell frame 62, a printed wiring board 63, a CCD camera 64, a CCD connector 65 and an O ring 66.

The frame member 61 is formed in a frame shape (the plane shape of the outer edge thereof has a rectangular frame shape in the example shown in the figure). The shell frame 62 is formed in a frame shape so as to have a size almost same as that of the frame member 61. The shell frame 62 is piled on the frame member 61 so as to have an interval therebetween.

The printed wiring board 63 is formed in a manner that the plane shape thereof has a rectangular shape same as the shape of the outer edge of each of the frame member 61 and the shell frame 62. The printed wiring board 63 is sandwiched between the frame member 61 and the shell frame 62. Further, the printed wiring board 63 electrically couples between the CCD camera 64 and the CCD connector 65.

The CCD camera 64 is mounted on the surface of the printed wiring board 63 opposing to the ceiling wall 45 of the upper casing 6. The CCD camera 64 includes a lens 67 facing within the round hole 47 of the ceiling wall 45 of the upper casing 6. The CCD camera 64 picks-up an image of the outside of the upper casing 6 through the lens 67.

The CCD connector 65 is mounted on the surface of the printed wiring board 63 opposing to the bottom wall 48 of the lower casing 7. The O ring 66 is formed by elastic composite resin and configured in a ring shape. The O ring 66 is disposed between the periphery of the lens 67 of the CCD camera 64 and the periphery of the round hole 47 of the ceiling wall 45 of the upper casing 6 to thereby keep the space therebetween in the watertight state, whereby liquid such as water can be prevented from entering into the upper casing 6.

The aforesaid camera unit 60 is assembled by sequentially laminating the frame member 61, the printed wiring board 63 mounting the CCD camera 64 and the CCD connector 65 thereon, and the shell frame 62 in this order. Then, the O ring 66 is laminated around the periphery of the lens 67 of the CCD camera 64 and attached to the upper casing 6.

As shown in FIG. 2, the coupling unit 70 includes the board 71, a connector 72 and an FPC (flexible printed circuit) 73. The board 71 includes a pair of printed wiring boards 74 which are piled with a space therebetween. The pair of printed wiring boards 74 sandwich the one end portion 73*a* of the FPC 73 therebetween. The board 71 is provided with the plurality of through holes 75. The bosses 57 of the lower casing 7 respectively engage with the plurality of through holes 75 to thereby attach the board 71 to the lower casing 7.

The connector 72 is mounted on the surface of the printed wiring board 63 opposing to the ceiling wall 45 of the upper casing 6. The connector 72 is coupled with the CCD connector 65.

The FPC 73 includes line-shaped conductors each formed by copper alloy etc. and a pair of insulation films which sandwich the conductors therebetween and each of which is formed by composite resin such as polyimide. The FPC 73 is attached to the board 71 in a manner that the one end portion 73*a* thereof is sandwiched between the pair of printed wiring boards 74 to thereby electrically connect the conductors with the connector 72. The FPC 73 is attached to the erected plate portion 53 in a manner that the other end portion 73*b* thereof is passed into the opening portion 55 of the lower casing 7, then introduced to the outside of the lower casing 7 and overlapped on the erected plate portion 53.

At the other end portion 73*b* of the FPC 73, the insulation film thereof is partially removed to thereby expose the conductors. The FPC 73, that is, the coupling unit 70 is electrically coupled to the monitor via the connector 5 and the shield harness 4 of the wire harness 3 fitted to the connector portion 50 of the lower casing 7. Further, since the FPC 73 has the flexibility itself, a center portion 73*c* between the one end portion 73*a* and the other end portion 73*b* forms a deformable portion capable of deforming freely.

As shown in FIG. 2, the shield shell 9 includes a pair of shell members 80 which are assembled to each other to cover the camera unit 60 of the electronic device unit 8. Each of the pair of shell members 80 is formed by bending a conductive metal plate etc. The pair of shell members 80 are provided with engagement portions 81 and engagement reception portions 82 which are fixed to each other. When the pair of shell members 80 are fixed to each other, the pair of shell members configure a frame shape and cover the frame member 61, the printed wiring board 63, the CCD camera 64, the CCD connector 65 and the shell frame 62.

The ground shell 10 is formed by conductive metal etc. and includes, as shown in FIG. 2, a flat plate portion 83 of a flat plate shape to be piled on the bottom wall 48 of the aforesaid lower casing 7, contact pieces 84 each erected from the outer edge 83*c* of the flat plate portion 83 toward the lower casing 7, and a cylindrical contact member 85 protruded from the rear surface 83*b* of the flat plate portion 83 on a side thereof apart from the lower casing 7.

The flat plate portion 83 is formed in a rectangular shape in a manner that the size of the plane shape thereof is smaller than that of the outer edge of the bottom wall 48 of the lower casing 7. The flat plate portion 83 is provided with an opening portion 86 through which the cylindrical portion of the connector portion 50 of the lower casing 7 is passed, a through hole 87 through which the lock receiving portion 52 of the connector portion 50 is passed, and holes 88 through which the screws 13 are passed. The opening portion 86 is arranged in a manner that the height of the edge thereof coincides with that of the surface of the contact member 85.

Figure 5:
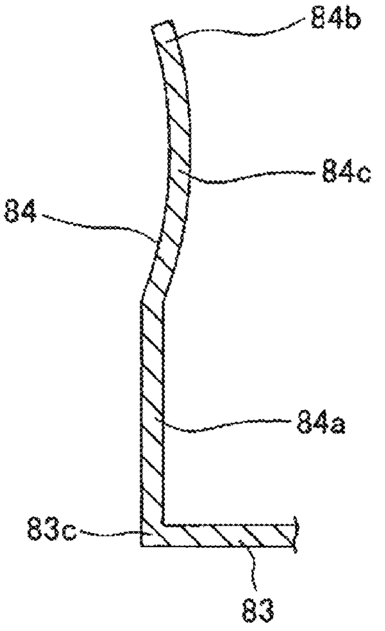
FIG. 5 is an enlarged sectional diagram of a contact piece shown in FIG. 4.

As shown in FIG. 2 or 5, the contact piece 84 is formed in a belt shape and configured in a manner that the one end portion 84*a* in the longitudinal direction thereof is coupled with the outer edge 83*c* of the flat plate portion 83 and the other end portion 84*b* thereof is a free end. In the contact piece 84, a center portion 84*c* between the one end portion 84*a* and the other end portion 84*b* is formed to have an arc shape protruded toward the center of the flat plate portion 83, whereby the contact piece elastically deforms so as to allow the one end portion 84*a* to deform in a direction of contacting with and separating from the flat plate portion 83. A plurality of the contact pieces 84 are provided with an interval therebetween along the outer edge 83*c* of the flat plate portion 83.

As shown in FIG. 4, in the contact piece 84, the other end portion 84*b* is passed through the hole 56 of the lower casing 7, then protrudes toward the inside of the lower casing 7 and contacts with the shield shell 9 within the lower casing 7. The other end portion 84*b* of the contact piece 84 corresponds to a contact portion and the center portion 84*c* corresponds to an elastic deformation portion.

The contact member 85 is formed in a rectangular cylindrical shape. The contact member 85 is configured in a manner that the inner diameter thereof is almost same as the outer diameter of the cylindrical portion of the connector portion 50 of the lower casing 7 and the outer diameter thereof is almost same as the inner diameter of the shield member 22 of the aforesaid connector 5.

In the aforesaid contact member 85, when the flat plate portion 83 is piled on the bottom wall 48 of the lower casing 7 and then attached to the lower casing 7, the contact member houses the cylindrical portion therein so as to cover the outer periphery of the cylindrical portion of the connector portion 50 of the lower casing 7. Then, the contact member 85 is passed within the hole 11 of the rear panel 2, then inserted into the shield member 22 housed within the outer housing 25 of the aforesaid connector 5, and contacts with the shield member in a manner that the inner surface of the shield member 22 is laminated on the outer surface of the contact member 85.

In the aforesaid electric apparatus module 1, the lower casing 7 is filled therein with potting material 90 (shown in FIG. 4) which is filled in a liquid state and hardened. The potting material 90 is formed by silicone, for example. This silicone is preferably room temperature curing silicone rubber having thixotropy (a property of being changed in a state such as a liquid state having a high flowability when applied with vibration of constant level or more etc. and changed in a state such as a solid state having lower flowability than the liquid state) when placed in a static state. The potting material 90 restricts a phenomenon that the liquid enters into the upper casing 6 and the lower casing 7 via the opening portion 55.

The aforesaid electric apparatus module 1 is assembled in the following manner. First, when the pair of shell members 80 are assembled to each other, the shield shell 9 covers the camera unit 60 of the electronic device unit 8. Then, the camera unit 60 of the electronic device unit 8 housed within the shield shell 9 is attached to the upper casing 6.

Next, the other end portion 73*b* of the FPC 73 is inserted in the opening portion 55 of the lower casing 7 and superimposed on the erected plate portion 53 and so attached to the erected plate portion 53. Further, the bosses 58 of the lower casing 7 are engaged with the through holes 75 of the board 71 to thereby attach the board 71 to the lower casing 7. Thereafter, the potting material 90 in a liquid state is filled into the lower casing 7 to thereby harden the potting material 90. In this manner, the coupling unit 70 of the electronic device unit 8 is attached to the lower casing 7.

Then, the upper casing 6 and the lower casing 7 are attached to each other while fitting the connector 72 of the coupling unit 70 to the CCD connector 65 of the camera unit 60.

Succeedingly, the flat plate portion 83 of the ground shell 10 is superimposed on the bottom wall 48 of the lower casing 7, then the cylindrical portion of the lower casing 7 is inserted into the opening portion 86 of the ground shell 10 and also the lock receiving portion 52 of the lower casing 7 is passed through the through hole 87 of the ground shell 10 to thereby attach the ground shell 10 to the lower casing 7. As a result, the contact pieces 84 of the ground shell 10 contact with the shield shell 9 within the lower casing 7, whereby the shield shell 9 is directly coupled to the ground shell 10.

Lastly, the screws 13 passed through the holes 12 of the rear panel 2 are passed through the holes 88 of the ground shell 10 and screwed into the screw holes of the lower casing 7, respectively, whereby the electric apparatus module 1 is attached to the rear panel 2 of an automobile.

Then, at the time of coupling the aforesaid connector 5 of the wire harness 3 to the electric apparatus module 1 assembled in the aforesaid manner, firstly the connector 5 of the wire harness 3 is faced to the connector portion 50 of the lower casing 7 of the electric apparatus module 1. Then, the connector 5 is approached to the connector portion 50 to thereby enter the cylindrical portion of the connector portion 50 between the outer housing 25 and the inner housing 26 of the connector housing 21 of the connector 5.

As a result, the lock receiving portion 52 of the connector portion 50 enter between the pair of guide ribs 29 of the outer housing 25 and the lock portion 32 of the arm portion 31 of the lock arm 28 of the outer housing 25 abuts against the lock receiving portion 52.

Further, when the cylindrical portion of the connector portion 50 is entered between the outer housing 25 and the inner housing 26, the erected plate portion 53 of the connector portion 50 enters into the small diameter portion 33 of the inner housing 26, whereby the one end portion of each of the terminal attachments 24 of the insert terminals 20 is coupled with the other end portion 73*b* of the FPC 73 of the coupling unit 70 piled on the erected plate portion 53.

In this case, the arm portion 31 of the lock arm 28 bends so that the lock portion 32 approaches the outer housing 25, whereby the lock portion 32 engages with the lock hole 54 of the lock receiving portion 52. Thus, since the lock arm 28 engages with the lock receiving portion 52, the engagement between the connector 5 and the connector portion 50 is held.

In this manner, when the connector 5 of the wire harness 3 is coupled to the connector portion 50 of the electric apparatus module 1 to thereby couple the one end portion of each of the terminal attachments 24 of the connector 5 with the other end portion 73*b* of the FPC 73, the electric wires 15 of the shield harness 4 respectively coupled to the other end portions of the terminal attachments 2 are electrically coupled to the conductive pattern of the printed wiring board 63 coupled to the FPC 73, that is, the coupling unit 70.

According to the embodiment, the conductive ground shell 10 to be attached to the lower casing 7 to be attached to the rear panel 2 includes the flat plate portion 83 to be superimposed on the rear panel 2; the contact pieces 84 each of which is erected from the outer edge 83*c* of the flat plate portion 83 toward the lower casing 7, then passed through the hole 56 penetrating the lower casing 7 and contacts with the conductive shield shell 9 covering the electronic device unit 8; and the contact member 85 which is protruded from the rear surface 83*b* on the rear panel 2 side of the flat plate portion 83, then passed through the hole 11 penetrating the rear panel 2 and contacts with the cylindrical shield member 22 of the connector 5 of the wire harness 3 coupled to the monitor as the external device.

Thus, since the shield shell 9 covering the electronic device unit 8 is made directly in contact with the ground shell 10 to thereby directly contact the ground shell 10 to the shield member 22 of the connector 5 to thereby couple to the rear panel 2, noise entering into the electronic device unit 8 from the outside can be released to the rear panel 2 via the shield shell 9, the shield member 22 and the ground shell 10 without passing through an electric circuit coupled to the electronic device unit 8. Thus, the entering of noise can be surely prevented and so good shielding efficiency can be attained.

Further, since the shield shell 9 and the shield member 22 of the connector 5 can be coupled to the rear panel 2 via the ground shell 10, the increase of the number of components and the number of assembling processes can be suppressed. Thus, the assembling procedure can be performed easily.

Further, the contact piece 84 includes the other end portion 84*b* contacting with the shield shell 9 and center portion 84*c* which is provided between the other end portion 84*b* and the flat plate portion 83 and elastically deforms so as to allow the other end portion 84*b* to deform in a direction of contacting with and separating from the flat plate portion 83.

Thus, since the contact pieces 84 of the ground shell 10 can be easily and surely made in contact with the shield shell 9, the shield shell 9 can be surely coupled to the rear panel 2 via the ground shell 10 and the coupling procedure between the shield shell 9 and the ground shell 10 can be simplified. As a result, noise entering into the electronic device unit 8 from the outside can be surely released to the rear panel 2 via the shield shell 9 and the ground shell 10. Further, the number of the processes for assembling the shield shell 9 and the ground shell 10 can beg suppressed.

Further, since the plurality of contact pieces 84 are provided with the interval therebetween along the outer edge 83*c* of the flat plate portion 83, a plurality of the contact portions are provided between the shield shell 9 and the ground shell 10 and the contact portions are disposed around the electronic device unit 8. Thus, the shield shell 9 and the ground shell 10 can be directly made in contact to each other surely.

Accordingly, since the shield shell 9 can be surely coupled to the rear panel 2 via the ground shell 10, noise entering into the electronic device unit 8 from the outside can be surely released to the rear panel 2 via the shield shell 9 and the ground shell 10.

Further, the contact member 85 is configured to have the cylindrical shape in a manner that the outer diameter thereof is almost same as the inner diameter of the shield member 22. When the contact member is inserted into the shield member 22, the contact member contacts with the shield member in a manner that the inner surface of the shield member 22 is overlapped on the outer surface of the contact member 85. Thus, the ground shell 10 can be made in contact with the shield member 22 of the connector 5 by inserting the contact member 85 into the shield member 22.

Thus, the shield member 22 of the connector 5 can be surely coupled to the rear panel 2 via the ground shell 10 and the coupling procedure between the shield member 22 of the connector 5 and the ground shell 10 can be simplified. As a result, noise entering into the electronic device unit 8 from the outside can be surely released to the rear panel 2 via the shield member 22 of the connector 5 and the ground shell 10, and the number of the processes for assembling the shield member 22 of the connector 5 and the ground shell 10 can beg suppressed.

Next, in order to ascertain the actions and effects of the electric apparatus module 1 described in the aforesaid embodiment, inventors of the present invention measured the radiation electric field intensities at the time of transmitting a digital signal to the electric apparatus module of each of the embodiment and a comparative example via the wire harness and confirmed the measuring results. The results of the measurement of the radiation electric field intensities will be explained with reference to FIG. 6.

The electric apparatus module according to the embodiment was compared with the comparative example in a manner that the product according to the present invention is configured by using a metal casing resembled as the shield shell 9 and the ground shell 10 of the electric apparatus module 1 described in the aforesaid embodiment.

Comparative Example

The electric apparatus module (not shown) according to the comparative example was configured not to include the ground shell 10 of the electric apparatus module 1 according to the aforesaid embodiment. That is, the electric apparatus module according to the comparative example was configured in a manner that a shield shell was coupled to a printed wiring board to thereby couple to a grounding circuit and the drain line of a wire harness was coupled to the printed wiring board.

Figure 6:
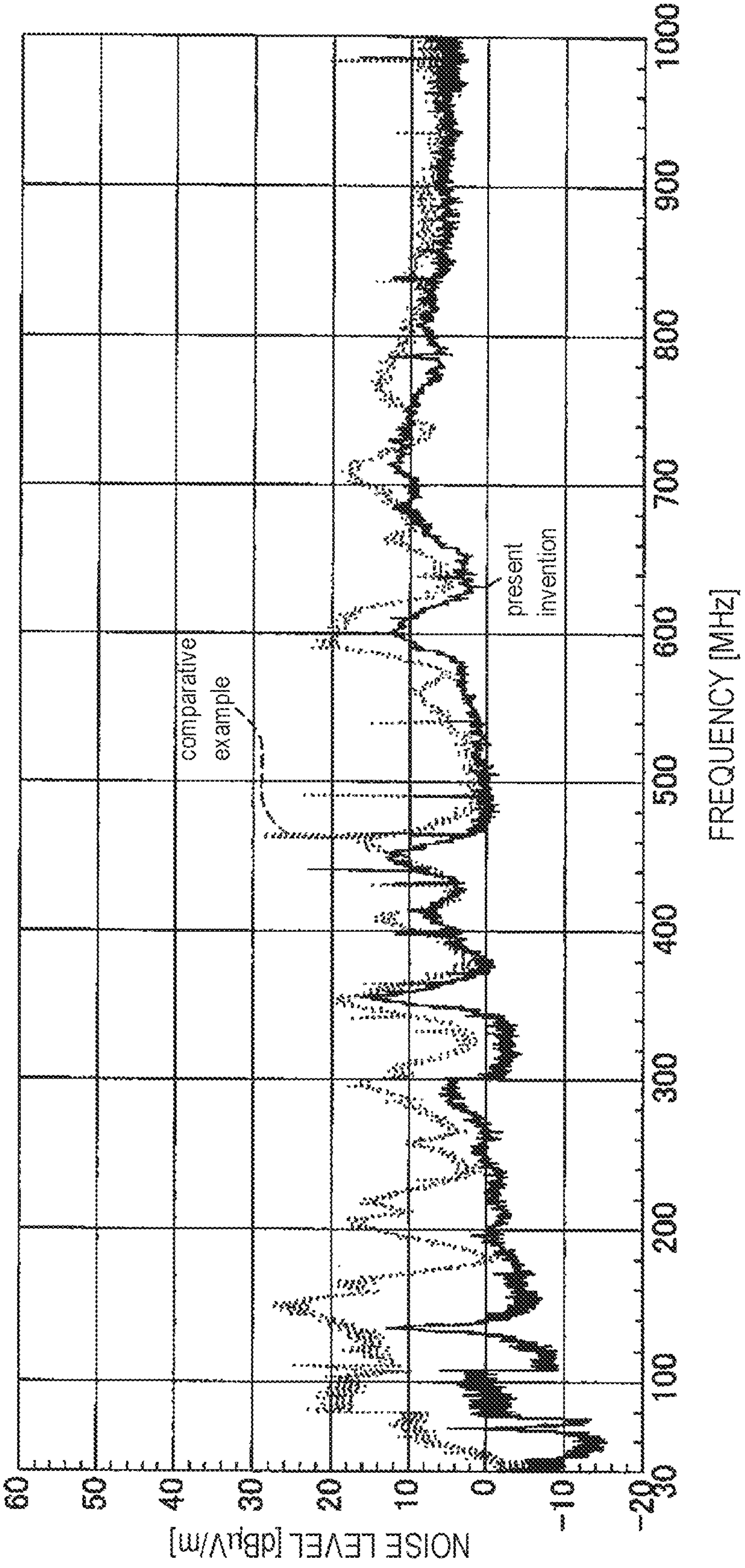
FIG. 6 is a graph showing measurement results of radiation electric field intensities in the electric apparatus modules according to a product of the invention and a comparative example.

The method of measuring the radiation electric field intensities was accorded to CIPR25 as the International Standard. That is, in a stat where an antenna was set at a position apart from the electric apparatus module by a predetermined distance (3 m, for example) within an anechoic chamber and a digital signal was transmitted to the electric apparatus module, the antenna received noise generated from the electric apparatus module and a spectrum analyzer measured the received noise. FIG. 6 is a graph showing a comparison of the measurement results between the product according to the present invention and the comparative example.

FIG. 6 is a graph showing the measurement results of the radiation electric field intensities in the electric apparatus modules according to the product of the invention and the comparative example. In FIG. 6, an abscissa represents frequencies which includes a frequency band from 30 [MHz] to 1,000 [MHz] as the noise frequency at the time of transmitting the digital signal to the electric apparatus module 1 described in the aforesaid embodiment, that is, during the communication of the electric apparatus module 1. An ordinate represents noise levels represented by [dBμV/m] as the unit. Further, in FIG. 6, the measurement results of the product of the present invention according to the embodiment is shown by a steady line and the measurement results of the comparative example is shown by a dotted line.

According to the graph of FIG. 6, it will be understood that when the radiation electric field intensities was measured by using the electric apparatus module of the comparative example, the noise level was high as a whole and a large peak appeared in the frequency range around 150 [MHz]. The maximum value of the noise level was about 29 [dBμV/m] at the frequency of about 460 [MHz].

When the radiation electric field intensities was measured by using the electric apparatus module as the product of the present invention, the noise level was lower than the noise level of the comparative example, and the maximum value of the noise level was about 23 [dBμV/m] at the frequency of about 440 [MHz] which was lower than the maximum value of the noise level of the comparative example.

According to the aforesaid measurement results of the radiation electric field intensities, it was clarified that the electric apparatus module according to the product of the present invention can effectively suppress noise as compared with the electric apparatus module according to the comparative example.

Although the aforesaid embodiment uses the FPC 73 in the coupling unit 70, the present invention may of course use a known FFC or a bus bar in place of the FPC 73.

The aforesaid embodiment merely shows the representative mode according to the invention and the invention is not limited this embodiment. That is, the invention may be implemented in various modified manners within a range not departing from the gist of the invention.

The invention is based on Japanese Patent Application (Japanese Patent Application No. 2008-133976) filed on May 22, 2008, the content of which is incorporated herein by reference.

REFERENCE SIGNS LIST

1 electric apparatus module
2 rear panel
5 connector
6 upper casing

7 lower casing
8 electronic device unit
9 shield shell
10 ground shell
11 hole
22 shield member
56 hole
83 flat plate portion
83*b* rear surface (surface)
83*c* outer edge
84 contact piece
84*b* the other end portion (contact portion)
84*c* center portion (elastic deformation portion)
85 contact member

The invention claimed is:

1. An electric apparatus module comprising: an upper casing; a shield member having a cylindrical shape and covering a connector; a lower casing, attached to an attached member having a first through hole, having a second through hole, and to which the upper casing is attached; an electronic device unit, accommodated in the upper casing and the lower casing, and coupled to the connector; a conductive shield shell covering the electronic device unit; and a conductive ground shell, including a flat plate portion, a contact piece and a contact member, and provided between the lower casing and the attached member, wherein the flat plate portion is piled on the attached member, the contact piece is erected from the outer edge of the flat plate portion and contacts with the shield shell through the second through hole, and the contact member protrudes from the flat plate portion and contacts with the cylindrical shield member through the first through hole; wherein a plurality of the contact pieces are provided with an interval therebetween along the outer edge of the flat plate portion.

2. The electric apparatus module as set forth in claim 1, wherein the contact piece includes:

a contact portion contacting with the shield shell; and an elastic deformation portion provided between the contact portion and the flat plate portion and elastically deforming so as to allow the contact portion to deform in a direction of contacting with and separating from the flat plate portion.

3. The electric apparatus module as set forth in claim 1, wherein the contact member has a cylindrical shape having an outer diameter substantially equal to an inner diameter of the shield member, and is inserted into the shield member and contacts therewith so that the inner surface of the shield member is overlapped on the outer surface of the contact member.

* * * * *